United States Patent
Hsueh

(10) Patent No.: US 7,378,883 B1
(45) Date of Patent: May 27, 2008

(54) SOURCE FOLLOWER AND ELECTRONIC SYSTEM UTILIZING THE SAME

(75) Inventor: Fu-Yuan Hsueh, Taoyuan County (TW)

(73) Assignee: TPO Displays Corp., Miao-Li County (TW)

( * ) Notice: Subject to any disclaimer, the term of this patent is extended or adjusted under 35 U.S.C. 154(b) by 17 days.

(21) Appl. No.: 11/619,220

(22) Filed: Jan. 3, 2007

(51) Int. Cl.
*H03K 3/00* (2006.01)

(52) U.S. Cl. ..................... 327/108; 345/204

(58) Field of Classification Search ............... 327/108, 327/109; 326/83, 86; 345/204, 205, 98, 345/99
See application file for complete search history.

(56) References Cited

U.S. PATENT DOCUMENTS 6,876,235 B2 * 4/2005 Li et al. .................... 327/112
7,221,194 B2 * 5/2007 Lin et al. ................... 327/108
2007/0040591 A1 * 2/2007 Yu et al. .................... 327/108

* cited by examiner

*Primary Examiner*—N. Drew Richards
*Assistant Examiner*—An T. Luu
(74) *Attorney, Agent, or Firm*—Thomas, Kayden, Horstemeyer & Risley

(57) ABSTRACT

A source follower is disclosed. A driving transistor comprises a first gate receiving an input signal. An active load is connected to the driving transistor in series between a first voltage source and a second voltage source and coupled to the driving transistor at a first point. A first switch is coupled between the first voltage source and the first gate. A first capacitor is coupled to a second switch at a second point. A third switch is connected to the first capacitor at a third point and connected to the second switch and the first capacitor in series between the first gate and the second voltage source. A fourth switch is coupled between the third point and the first point. A fifth switch is coupled between the first point and a fourth point.

15 Claims, 5 Drawing Sheets

SOURCE FOLLOWER AND ELECTRONIC SYSTEM UTILIZING THE SAME

BACKGROUND OF THE INVENTION

1. Field of the Invention

The invention relates to a source follower and an electronic system utilizing the same.

2. Description of the Related Art

High gain analog amplifiers are typically high impedance and connect a load, such as a capacitor comprising high capacitance or a resistor comprising low impedance. When the load is a resistor comprising low impedance, a voltage buffer is disposed between the analog amplifier and the load for maintaining high gain effect. The voltage buffer refers to a source follower.

FIG. 1 is a schematic diagram of a conventional source follower. Source follower 100 comprises transistors 110 and 120. Transistors 110 and 120 are coupled between voltage sources Vdd and Vss. The gate of transistor 110 receives an input signal Vin and the source thereof provides an output signal Vout. Transistor 120 is served as a current source.

The size of transistor 110 is equal to that of transistor 120 for arriving to a voltage following effect. When the current flowing transistor 110 is equal to the current flowing transistor 120, the voltage difference between the gate and the source of transistor 110 is equal to the voltage difference between the gate and the source of transistor 120. Because the voltage difference between the gate and the source of transistor 120 is equal to zero, the voltage difference between the gate and the source of transistor 110 is also equal to zero. Thus, the output signal Vout is close to the input signal Vin.

BRIEF SUMMARY OF THE INVENTION

Source followers are provided. An exemplary embodiment of a source follower comprises a driving transistor, an active load, a first switch, a second switch, a third switch, a fourth switch, a fifth switch, and a first capacitor. The driving transistor comprises a first gate receiving an input signal. The active load is connected to the driving transistor in series between a first voltage source and a second voltage source and coupled to the driving transistor at a first point. The first switch is coupled between the first voltage source and the first gate. The first capacitor is coupled to the second switch at a second point. The third switch is connected to the first capacitor at a third point and connected to the second switch and the first capacitor in series between the first gate and the second voltage source. The fourth switch is coupled between the third point and the first point. The fifth switch is coupled between the first point and a fourth point.

Electronic systems are also provided. An exemplary embodiment of an electronic system comprises a voltage converter and a source follower. The voltage converter provides a first voltage source and a second voltage source. The source follower comprises a driving transistor, an active load, a first switch, a second switch, a third switch, a fourth switch, a fifth switch, and a first capacitor. The driving transistor comprises a first gate receiving an input signal. The active load is connected to the driving transistor in series between the first voltage source and the second voltage source and coupled to the driving transistor at a first point. The first switch is coupled between the first voltage source and the first gate. The first capacitor is coupled to the second switch at a second point. The third switch is connected to the first capacitor at a third point and connected to the second switch and the first capacitor in series between the first gate and the second voltage source. The fourth switch is coupled between the third point and the first point. The fifth switch is coupled between the first point and a fourth point.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
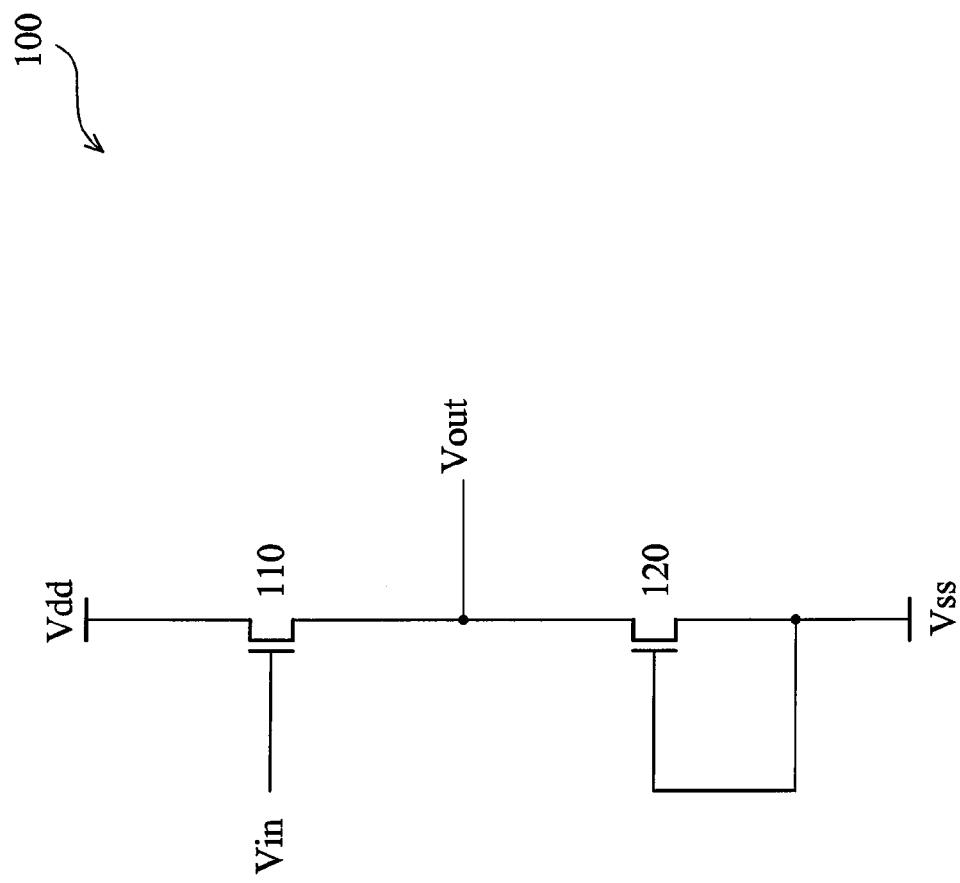
FIG. 1 is a schematic diagram of a conventional source follower.
Figure 2:
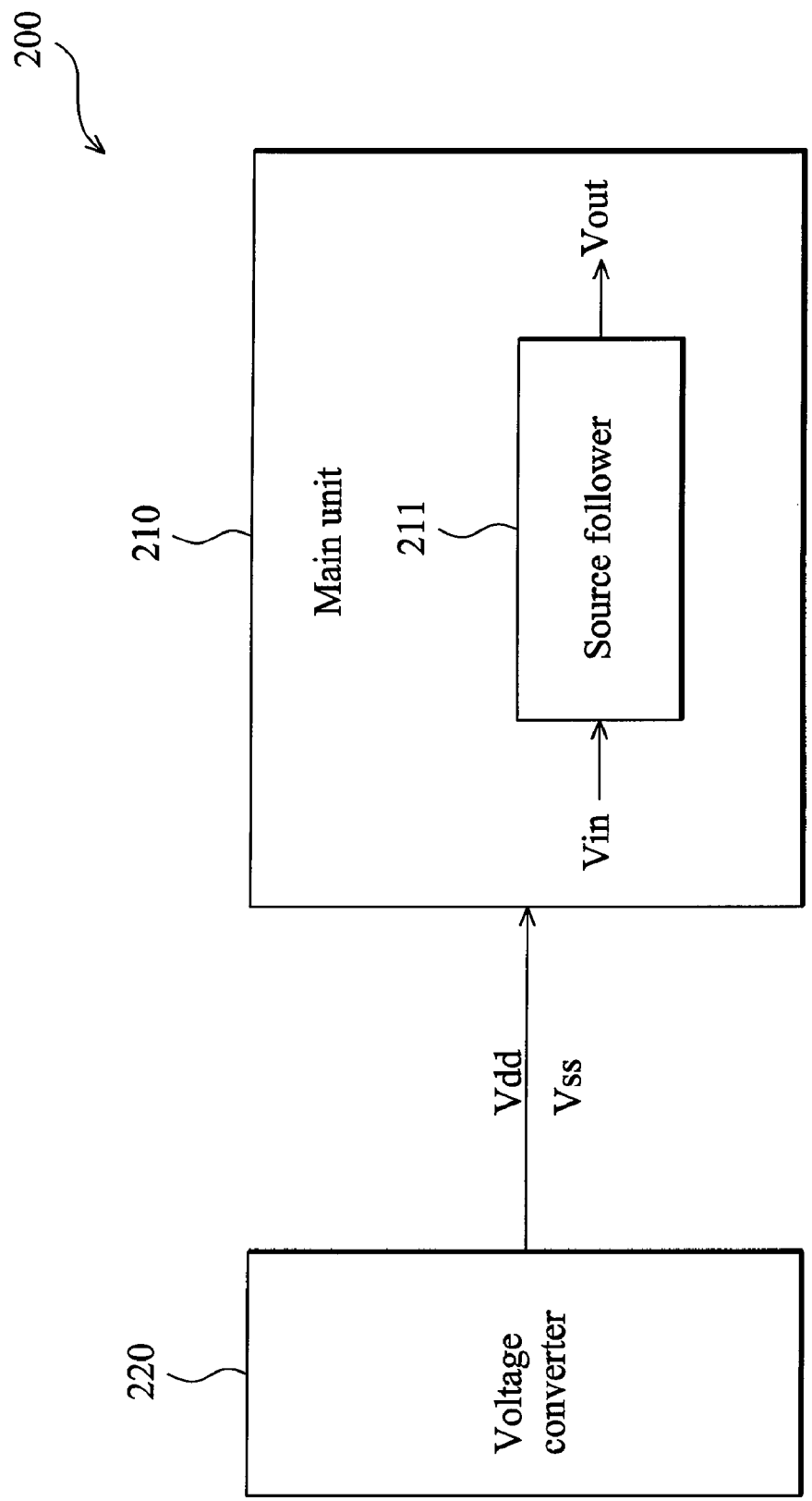
FIG. 2 is a schematic diagram of an exemplary embodiment of an electronic system.

FIG. 2 is a schematic diagram of an exemplary embodiment of an electronic system. The electronic system 200, such as a cellular phone, a personal digital assistant (PDA), a notebook, a personal computer, a car television, a digital still camera (DSC) or a liquid crystal display (LCD), comprises a main unit 210 comprising a source follower 211 and a voltage converter 220.

Main unit 210 executes functions related to electronic system 200. Voltage converter 220 provides voltage sources Vdd and Vss to main unit 210. In this embodiment, source follower 211 is disposed within main unit 210. In some embodiments, source follower 211 is disposed without main unit 210. Source follower 211 is coupled to the voltage sources Vdd and Vss.

Figure 3:
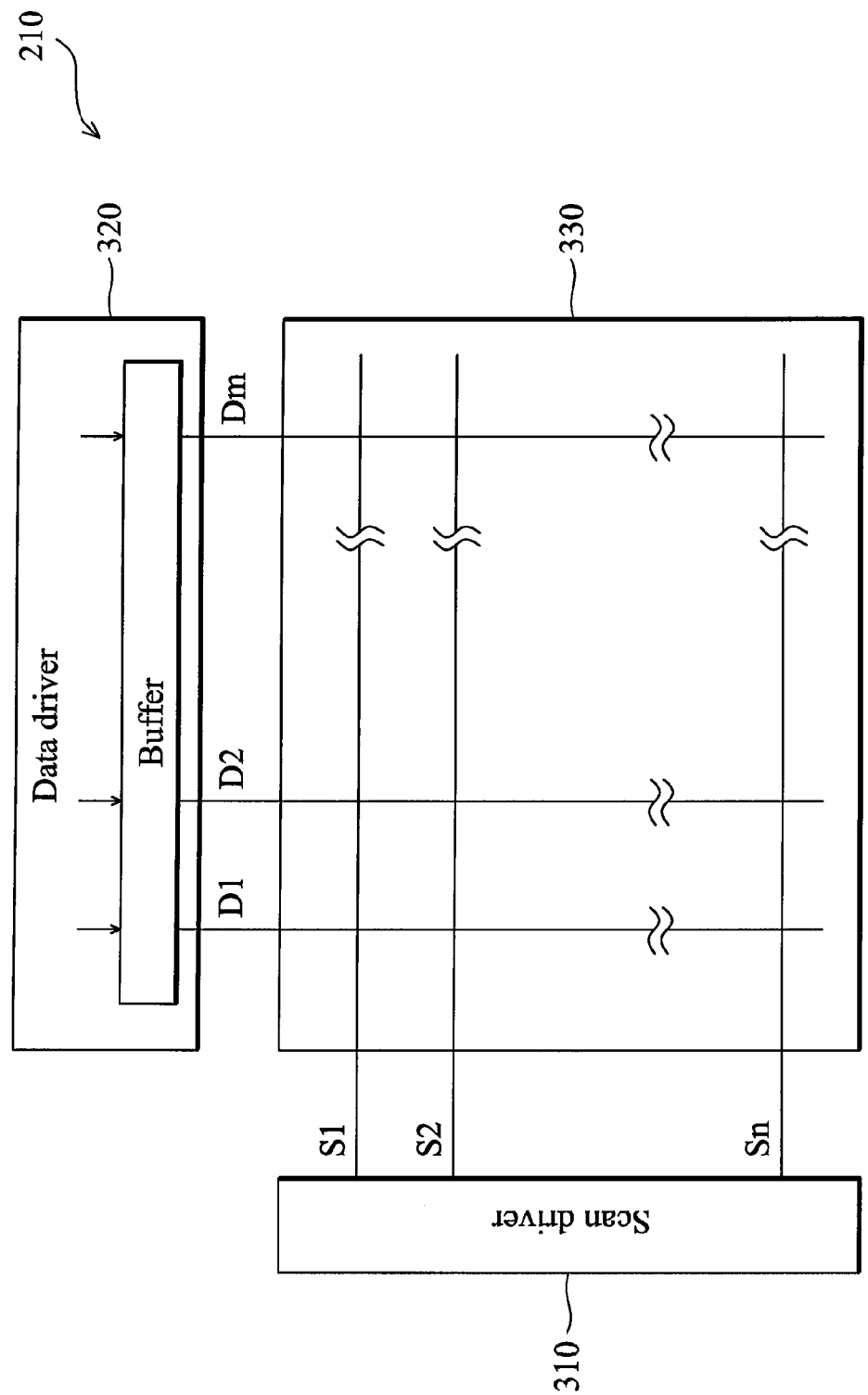
FIG. 3 is a schematic diagram of an exemplary embodiment of a main unit.

FIG. 3 is a schematic diagram of an exemplary embodiment of a main unit 210. When electronic system 200 is an LCD, main unit 210 comprises a scan driver 310, a data driver 320 and a display module 330, wherein the data driver 320 comprises source follower 211.

Scan driver 310 provides scan signals S1~Sn. Data driver 320 provides data signals D1~Dm. Display module 330 displays an image according to scan signals S1~Sn and data signals D1~Dm. The operation of an LCD is well known to those skilled in the art, thus, description thereof is omitted. The operating configuration of source follower 211 is described in greater detail with reference to FIG. 4.

Figure 4A:
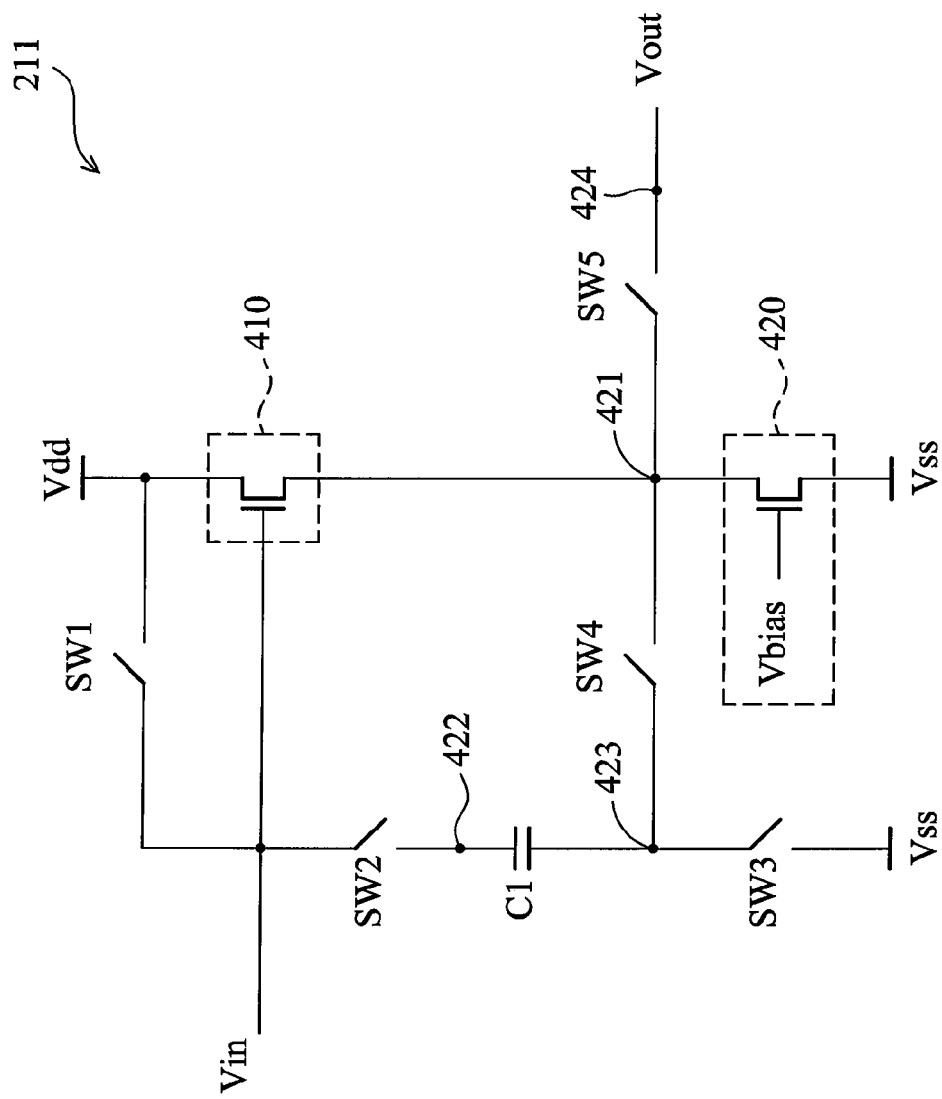
FIG. 4a is a schematic diagram of an exemplary embodiment of a source follower.

FIG. 4a is a schematic diagram of an exemplary embodiment of a source follower. Source follower 211 comprises a driving transistor 410, an active load 420, switches SW1~SW5, and a capacitor C1.

Driving transistor 410 comprises a gate receiving an input signal Vin. In this embodiment, driving transistor 410 is an N type transistor comprising a drain coupled to voltage source Vdd and a source coupled to active load 420.

Active load 420 is connected to driving transistor 410 in series between voltage sources Vdd and Vss and coupled to the driving transistor 410 at a point 421. Active load 420 is a current source providing current. In this embodiment, active load 420 is an N type transistor comprising a gate receiving a reference voltage Vbias, a drain coupled to driving transistor 410, and a source coupled to voltage source Vss.

Switch SW1 is coupled between voltage source Vdd and the gate of driving transistor 410. Switch SW2 is coupled to capacitor C1 at a point 422. Switch SW3 is coupled to capacitor C1 at a point 423 and connected to switch SW2 and capacitor C1 in series between the gate of driving transistor 410 and voltage source Vss. Switch SW4 is coupled between the point 421 and a point 423. Switch SW5 is coupled between the point 421 and a point 424.

During a first period, switches SW1, SW2, and SW4 are turned on and switches SW3 and SW5 are turned off such that the voltage stored in capacitor C1 is equal to threshold voltage Vt of driving transistor 410. During a second period subsequent to the first period, switch SW5 is turned on and switches SW1~SW4 are turned off such that the voltage of point 424 is equal to a voltage difference between the input signal Vin and the voltage stored in capacitor C1.

Figure 4B:
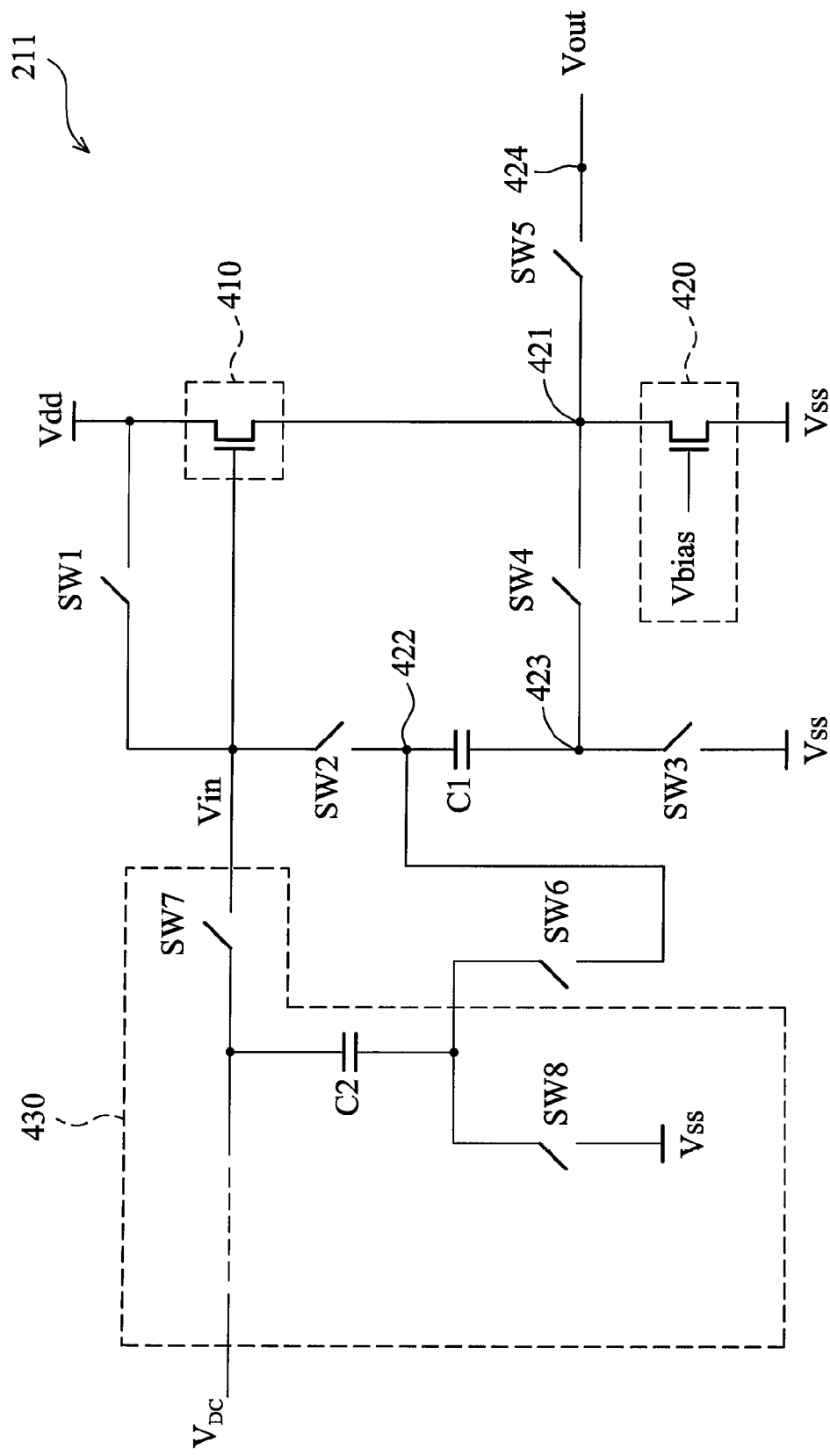
FIG. 4b is a schematic diagram of another exemplary embodiment of the source follower.

FIG. 4b is a schematic diagram of another exemplary embodiment of the source follower. FIG. 4b is similar to FIG. 4a with exception that source follower 211 shown in FIG. 4b further comprises digital/analog converter 430 and switch SW6.

Digital/analog converter 430 transforms a digital signal VDC into an analog signal and provides the analog signal served as the input signal Vin to the gate of driving transistor 410. Digital/analog converter 430 comprises a capacitor C2, switches SW7 and SW8. Capacitor C2 is connected to switches SW7 and SW8 in series between the gate of driving transistor 410 and voltage source Vss. Switch SW6 is coupled between switch SW8 and point 422.

When source follower 211 is coupled to digital/analog converter 430 comprising capacitor C2, a power sharing effect does not occur between source follower 211 and digital/analog converter 430 and an output signal Vout of source follower 211 is equal to the input signal Vin output from digital/analog converter 430.

The power sharing effect easily occurs when a source follower directly connects a digital/analog converter comprising capacitors. Thus, a portion of digital/analog converter is shown in FIG. 4b for describing that the power sharing effect does not occur between the source follower 211 and a digital/analog converter.

During a first period, switches SW1, SW2, SW4, and SW8 are turned on and switches SW3, SW4, SW6, and SW7 are turned off such that the voltage stored in capacitor C1 is equal to the threshold voltage of driving transistor 410.

During a second period subsequent to the first period, switches SW5, SW7, and SW8 are turned on and switches SW1~SW4, and SW6 are turned off such that the voltage Vout of point 424 is equal to the voltage difference between the input signal Vin and the voltage stored in capacitor C1. The input signal Vin is the output signal of digital/analog converter 430.

During a third period subsequent to the second period, switches SW5, SW6, and SW7 are turned on and switches SW1~SW4, and SW8 are turned off such that the voltage Vout of point 424 is equal to the input signal Vin.

In summary, when a digital/analog converter comprising capacitors directly connects to the source follower 211, the power sharing effect does not occur between the digital/analog converter and the source follower 211 and the output signal Vout is equal to the input signal Vin output from the digital/analog converter. Additionally, the complexity of circuit is reduced and usable space is increased when the source follower is integrated with a digital/analog converter.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A source follower, comprising:
   a driving transistor comprising a first gate receiving an input signal;
   an active load connected to the driving transistor in series between a first voltage source and a second voltage source and coupled to the driving transistor at a first point;
   a first switch coupled between the first voltage source and the first gate;
   a second switch;
   a first capacitor coupled to the second switch at a second point;
   a third switch connected to the first capacitor at a third point and connected to the second switch and the first capacitor in series between the first gate and the second voltage source;
   a fourth switch coupled between the third point and the first point; and
   a fifth switch coupled between the first point and a fourth point.

2. The source follower as claimed in claim 1, wherein the driving transistor is an N type transistor comprising a drain coupled to the first voltage source and a source coupled to the active load.

3. The source follower as claimed in claim 1, wherein the active load is a current source.

4. The source follower as claimed in claim 1, wherein the active load is an N type transistor comprising a gate receiving a reference voltage, a drain coupled to the driving transistor, and a source coupled to the second voltage source.

5. The source follower as claimed in claim 1, further comprising:
   a digital/analog converter providing the input signal; and
   a sixth switch coupled between the digital/analog converter and the second point.

6. The source follower as claimed in claim 5, wherein the digital/analog converter comprises:
   a seventh switch;
   a second capacitor connected to the sixth and the seventh switches in series between the first gate and the second point; and
   an eighth switch connected to the seventh switch and the second capacitor in series between the first gate and the second voltage source.

7. A control method for the source follower as claimed in claim 1, comprising:
   during a first period, only turning on the first, the second, and the fourth switches; and
   during a second period subsequent to the first period, only turning on the fifth switch.

8. A control method for the source follower as claimed in claim 6, comprising:

during a first period, only turning on the first, the second, the fourth, and the eighth switches;

during a second period subsequent to the first period, only turning on the fifth, the seventh, and the eighth switches; and during a third period subsequent to the second period, only turning on the fifth, the sixth, and the seventh switches.

9. An electronic system, comprising:
a voltage converter providing a first voltage source and a second voltage source; and
a source follower comprising:
   a driving transistor comprising a first gate receiving an input signal;
   an active load connected to the driving transistor in series between the first voltage source and the second voltage source and coupled to the driving transistor at a first point;
   a first switch coupled between the first voltage source and the first gate;
   a second switch;
   a first capacitor coupled to the second switch at a second point;
   a third switch connected to the first capacitor at a third point and connected to the second switch and the first capacitor in series between the first gate and the second voltage source;
   a fourth switch coupled between the third point and the first point; and
   a fifth switch coupled between the first point and a fourth point.

10. The electronic system as claimed in claim 9, wherein the driving transistor is an N type transistor comprising a drain coupled to the first voltage source and a source coupled to the active load.

11. The electronic system r as claimed in claim 9, wherein the active load is a current source.

12. The electronic system as claimed in claim 9, wherein the active load is an N type transistor comprising a gate receiving a reference voltage, a drain coupled to the driving transistor, and a source coupled to the second voltage source.

13. The electronic system as claimed in claim 9, wherein the source follower further comprises:
   a digital/analog converter providing the input signal; and
   a sixth switch coupled between the digital/analog converter and the second point.

14. The electronic system as claimed in claim 13, wherein the digital/analog converter comprises:
   a seventh switch;
   a second capacitor connected to the sixth and the seventh switches in series between the first gate and the second point; and
   an eighth switch connected to the seventh switch and the second capacitor in series between the first gate and the second voltage source.

15. The electronic system as claimed in claim 9, wherein the electronic system is a cellular phone, a personal digital assistant (PDA), a notebook, a personal computer, a car television, a digital still camera (DSC) or a liquid crystal display (LCD).

* * * * *